United States Patent
Weber et al.

(10) Patent No.: US 6,324,071 B2
(45) Date of Patent: *Nov. 27, 2001

(54) STACKED PRINTED CIRCUIT BOARD MEMORY MODULE

(75) Inventors: Rick Weber, Boise; James Howarth; Corey Larsen, both of Marsing, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,613

(22) Filed: Jan. 14, 1999

(51) Int. Cl.[7] ...................................... H05K 1/14
(52) U.S. Cl. ...................... 361/785; 361/784; 361/790; 361/803; 439/44; 439/69; 439/74; 228/180.21; 228/180.22
(58) Field of Search ..................... 361/785, 728, 361/729, 735, 744, 784, 743–745, 790, 774, 779, 771, 803; 439/44, 69, 83, 74, 91; 228/180.21, 180.22

(56) References Cited

U.S. PATENT DOCUMENTS

| | | |
|---|---|---|
| 4,133,592 * | 1/1979 | Cobaugh et al. ................. 439/74 |
| 4,558,914 * | 12/1985 | Prager et al. ................. 439/259 |
| 4,560,746 | 12/1985 | Rebhahn et al. . |
| 4,998,180 * | 3/1991 | McAuliffe et al. ................. 361/684 |
| 5,191,404 | 3/1993 | Wu et al. . |
| 5,200,917 | 4/1993 | Shaffer et al. . |
| 5,224,023 | 6/1993 | Smith et al. . |
| 5,270,964 | 12/1993 | Bechtolsheim et al. . |
| 5,359,493 | 10/1994 | Chiu . |
| 5,383,148 | 1/1995 | Testa et al. . |
| 5,383,269 | 1/1995 | Rathmell et al. . |
| 5,432,729 | 7/1995 | Carson et al. . |
| 5,465,229 | 11/1995 | Bechtolsheim et al. . |
| 5,502,667 | 3/1996 | Bertin et al. . |
| 5,532,954 | 7/1996 | Bechtolsheim et al. . |
| 5,575,686 * | 11/1996 | Noschese ................. 439/620 |
| 5,581,498 | 12/1996 | Ludwig et al. . |
| 5,604,871 * | 2/1997 | Pecone ................. 395/281 |
| 5,691,885 * | 11/1997 | Ward et al. ................. 361/735 |
| 5,740,020 * | 4/1998 | Palatov ................. 361/796 |
| 5,754,405 * | 5/1998 | Derouiche ................. 361/744 |
| 5,754,409 | 5/1998 | Smith . |
| 5,793,998 * | 8/1998 | Copeland et al. ................. 395/309 |

* cited by examiner

Primary Examiner—Leo P. Picard
Assistant Examiner—David Foster
(74) Attorney, Agent, or Firm—Knobbe Martens Olson & Bear LLP

(57) ABSTRACT

A stacked printed circuit board memory module in which a plurality of daughter circuit boards can be stacked onto a primary circuit board. The primary board and each of the plurality of daughter boards have electronic memory ICs mounted on the respective surfaces. The primary board and each of the daughter boards have mounted connectors so that the boards can be electrically and mechanically interconnected with another board.

24 Claims, 5 Drawing Sheets

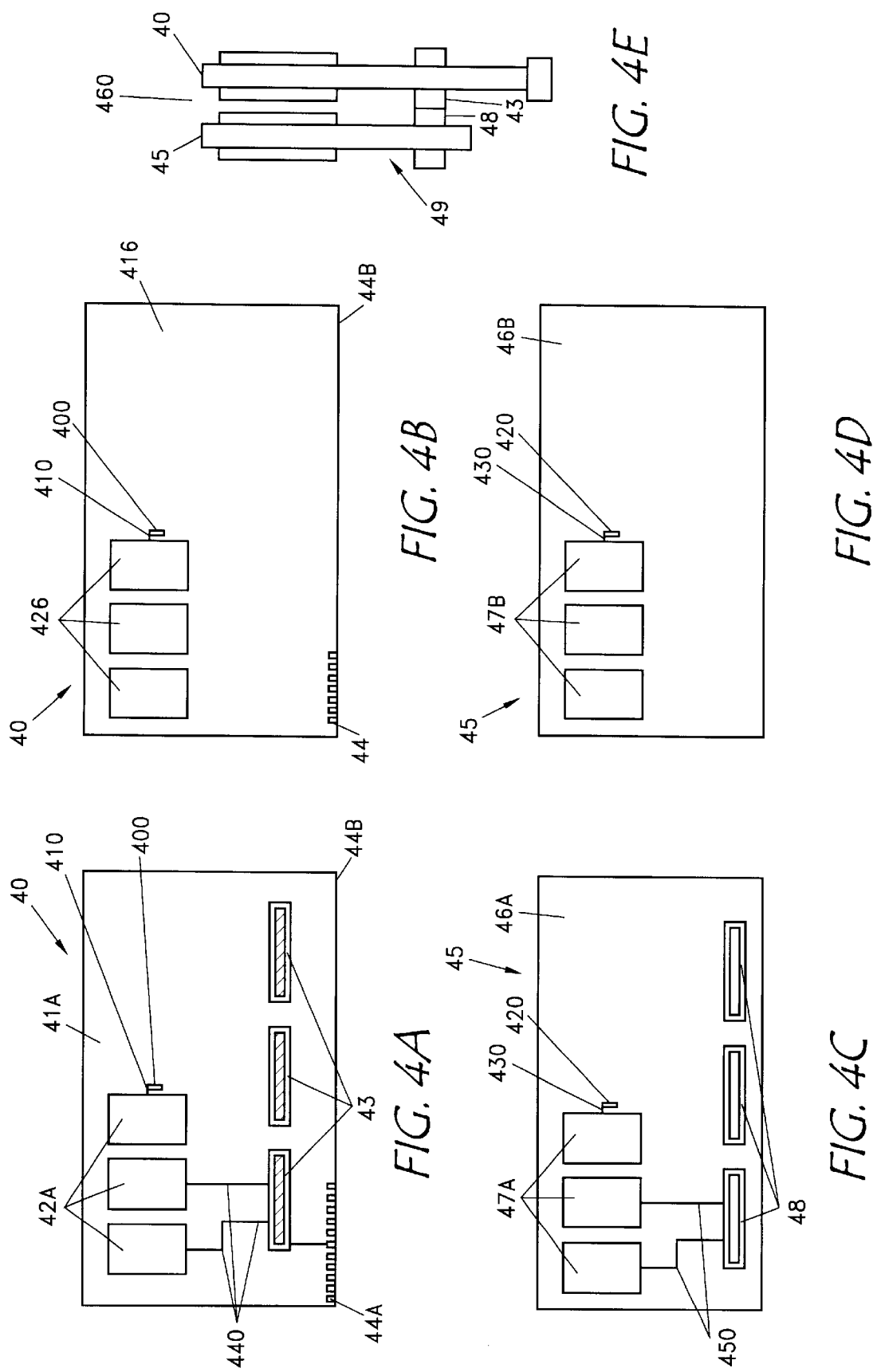

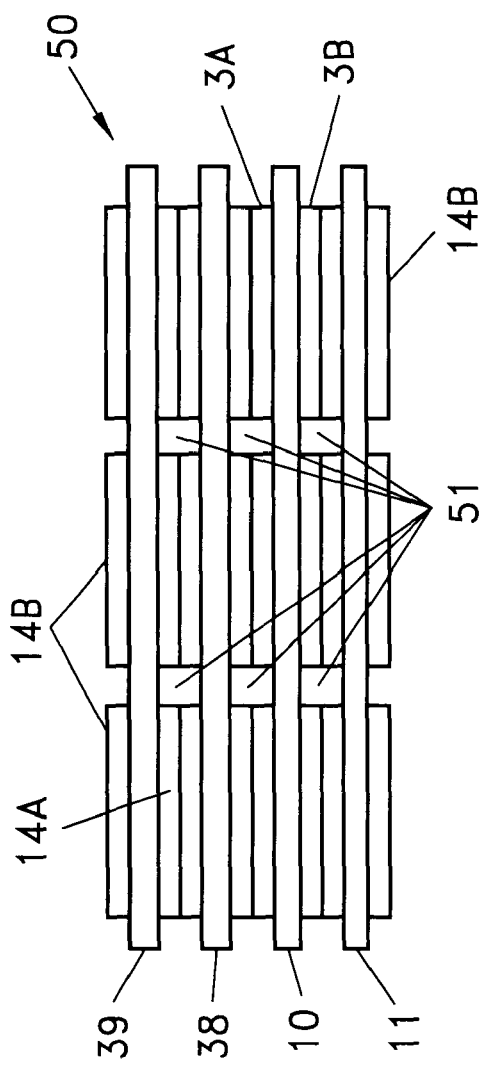
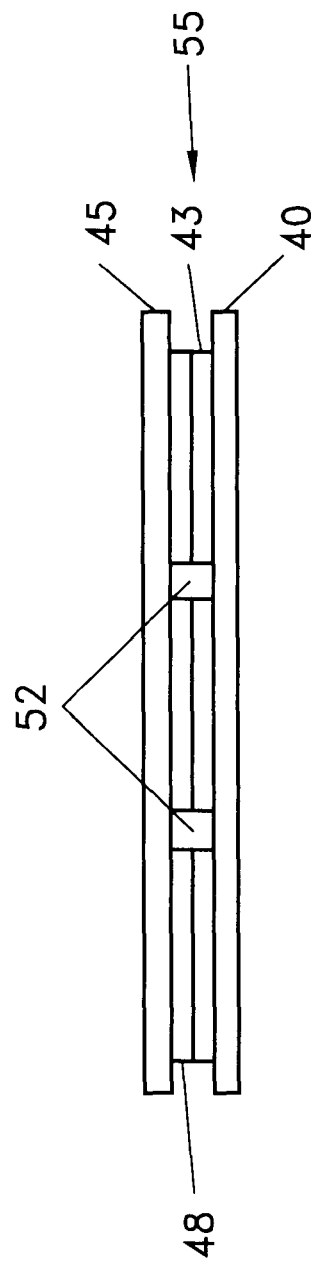
FIG. 5A
FIG. 5B

STACKED PRINTED CIRCUIT BOARD MEMORY MODULE

The invention relates to high density memory systems for high-speed computer and network systems, and more particularly to an improved high density memory module.

BACKGROUND OF THE INVENTION

With the introduction of network servers and work stations that can utilize memory in the gigabyte range and can operate at speeds of 100 Mhz or higher, fast and high density memory modules are needed to reach these memory capacities and speeds. Present day computer systems typically include hundreds of discrete components mounted on printed circuit boards (PCBs) interconnected with wiring on the board. The PCBs may also include sockets and connectors for receiving additional components, component modules and multichip modules, and connectors to other PCBs.

Computer memory often consists of one or more memory modules which plug into connectors on main printed circuit boards in computers (motherboards). The PCB memory module connector sockets are interconnected by a common set of address, data and control lines. Generally, there are several memory module connectors and when the memory requirements increase, additional modules may be added onto the motherboards. However, as computer system speeds and memory requirements have continued to increase and more integrated devices are incorporated onto PCBs, traditional memory packaging schemes have become inadequate. A constant goal in designing integrated circuit (IC) modules is to pack more integrated circuitry into the same or less space. This may be accomplished by physically scaling down the electrical components, such as decreasing transistor size at the substrate level, thereby increasing transistor density on semiconductor chips. Another possibility has been to increase the number of integrated circuits on the PCB. With present PCB technology, ICs may be mounted on both surfaces (front and back) of the PCB using surface mount techniques. However, the PCBs generally cannot be increased in length or height due to space limitations imposed by available areas on motherboards and within computer housings thereby limiting the amount of PCB real estate available for additional memory ICs.

As the density requirements of modules increase, solutions are needed to meet these requirements. There are currently three solutions to meet the requirements. First, the individual PCB can be made larger to accommodate more memory chips, this includes folding the PCB in half using a flex circuit. However, increasing the number of chips on individual boards consequently increases the length of the traces between chips and other PCBs. The increase in the trace length has caused a deviation from standards which require certain lengths to be maintained in order to prevent skew among clock, address, and data signals. Other transmission line problems occur when these high speed signals are transmitted over traces that are too long. Such problems include reflections, cross-talk, and electromagnetic induction. Therefore, placement of memory ICs on PCBs is critical to design considerations when trying to increase memory capacity and density.

The second solution to increase memory density is to decrease semiconductor die size to fit more memory in the same semiconductor package. However, decreasing die size while increasing memory density leads to greater costs. The industry norm is a 64 Megabit die. There have been increases to a 128 Megabit and 256 Megabit die but with a corresponding increase in cost of approximately five to six times.

The third solution to increasing memory density is to stack semiconductor die in the same package. While this solution increases the memory density, heat dissipation becomes a problem. Each of the individual ICs become hot and the heat cannot be properly dissipated from the PCB. The increased heat causes the performance of the memory module to decrease and often fail. As a result, the memory modules cannot be run at full performance. Often clock speeds and data transfers have to be decreased to reduce heat generated by the modules. Moreover, heat generation problems limit the number of memory modules that can be populated on a PCB, degenerating performance. Therefore, the number of memory ICs that can be placed on any given PCB memory module is limited due to heat dissipation and other considerations.

SUMMARY OF THE INVENTION

In an implementation of the invention, a memory module is provided that can stand alone as a primary board for insertion into a motherboard of a computer. The primary board has capability to receive additional daughter printed circuit boards on either surface. These additional daughter printed circuit boards provide additional memory to the computer without taking up an additional memory module socket. Additional daughter boards may be inserted to the daughter boards already connected to the primary board, without taking up any additional slots on the motherboard. The connectors between the primary board and each additional daughter board provide the electronic coupling necessary for the motherboard to send and receive data and address information. These connectors are placed so as to shorten the overall trace length of the memory module. Open air channels at the upper end of each of the primary and daughter boards aid in heat dissipation thereby increasing overall performance of the module.

Other features and advantages will be readily apparent from the following detailed description, the accompanying drawings and the claims.

BRIEF DESCRIPTION OF THE DRAWINGS

FIG. 4A is a front view of a primary circuit board showing a female connector.

FIG. 4B is a rear view of a primary circuit board having no connector.

FIG. 4C is a front view of a daughter circuit board having a male connector.

FIG. 4D is a rear view of a daughter circuit board having no connector.

FIG. 4E is a sideview of a stacked printed circuit board memory module including a primary board and a daughter board.

FIG. 5A is a bottom view of a stacked printed circuit board memory module including a primary circuit board and three daughter circuit boards.

FIG. 5B is a bottom view of a stacked printed circuit board memory module including a primary circuit board and a daughter circuit board.

DETAILED DESCRIPTION

Figure 1A:
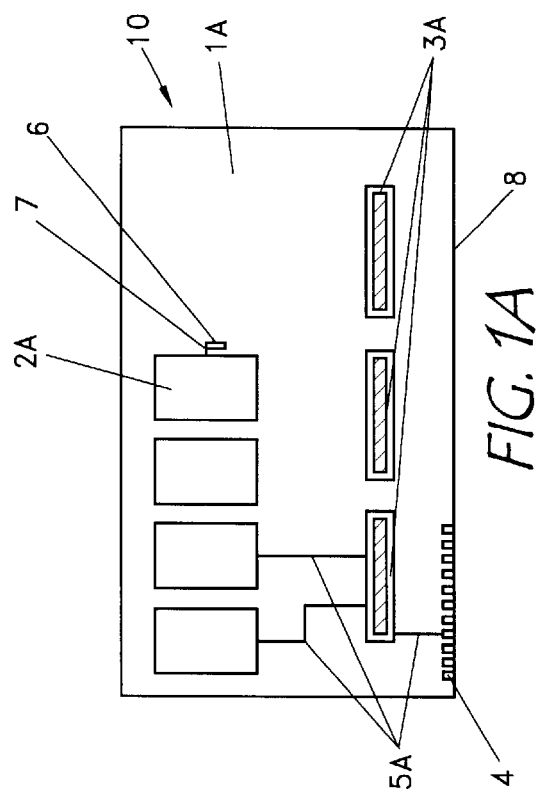
FIG. 1A is a front view of a primary circuit board.

Referring to FIG. 1A, there is shown a front view of a primary circuit board 10 with the first surface 1a facing forward. Electronic components 2a are mounted on the first surface 1a. Only four individual electronic components 2a are shown in the figure for the purpose of clarity. Additional components may be added in other implementations of the invention. In an implementation of the invention electronic components 2a may be Synchronous Dynamic Random Access Memory (SDRAM) ICs. Vias 6 are present on the surface 1a of the primary circuit board 10 in order to provide access to couple the electronic components 2a on the first surface of the primary board 1a to the other side of the board. Only one via 6 is shown in the figure. Via conductors 7 provide the electric coupling to components on the other side of the board. Only one via conductor 7 is shown in the figure. Primary connectors 3a are also mounted on first surface 1a. In an implementation of the invention female-type primary connectors may be mounted on the first surface 1a. Only a few conductive leads are shown for the purpose of clarity. Connectors 3a are adapted to receive connectors on a daughter circuit board. Conductive leads 4 define control connector which run along a connecting edge 8 of the primary board in order to electrically couple with a motherboard. Conductive leads carry the signals from the control and address lines of a control motherboard. Connecting edge 8 is designed to be received by a motherboard for mechanical support. Conductive paths 5a are mounted on the surface 1a in order to couple the electronic components 2a with the primary connectors 3a and with the conductive leads 4. Only a couple of conductive paths 5a are shown in the figure.

Figure 1B:
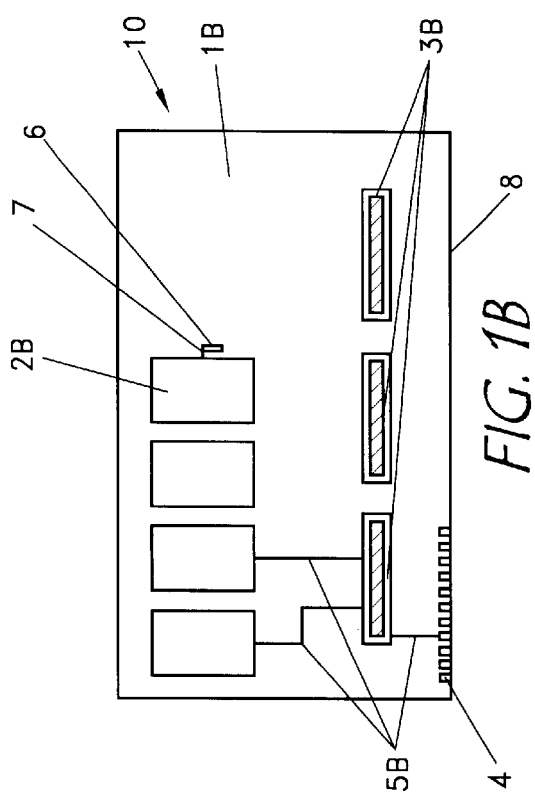
FIG. 1B is a rear view of a primary circuit board.

Referring now to FIG. 1B, there is shown a rear view of primary circuit board 10. Additional electronic components 2b are mounted on the surface 1b. Via 6 gives access to the front surface 1a and electronic components 2a of the primary board 10. Via conductor 7 couples electronic components 2a, 2b. Primary connectors 3b are adapted to receive daughter connectors from a daughter circuit board. Conductive paths 5b couple electronic components 2b with primary connectors 3b and conductive leads 4.

Figure 1C:
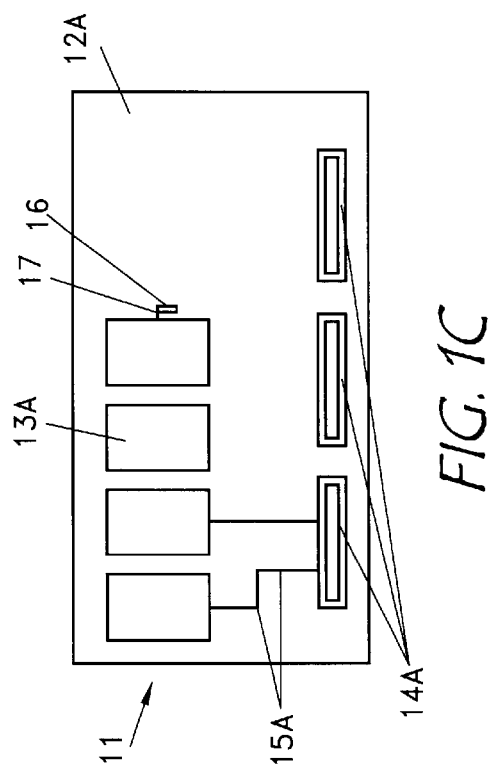
FIG. 1C is a front view of a daughter circuit board.

Referring now to FIG. 1C, there is shown a front view of a daughter circuit board 11. Electronic components 13a are mounted on the surface 12a. Via 16 allows electric coupling access to the other side of the daughter circuit board 11. Via conductor 17 allows electric coupling to electronic components on the other side of the daughter board 11. Daughter connectors 14a are mounted on the surface 12a. In an implementation of the invention daughter connectors 14a may be male-type connectors. The make-type connectors 14a are adapted to mechanically and electrically couple with primary connectors 3a. Connectors 14a may also mechanically and electrically couple with primary connectors 3b. Conductive paths 15a electrically couple daughter connectors 14a with electronic components 13a.

Figure 1D:
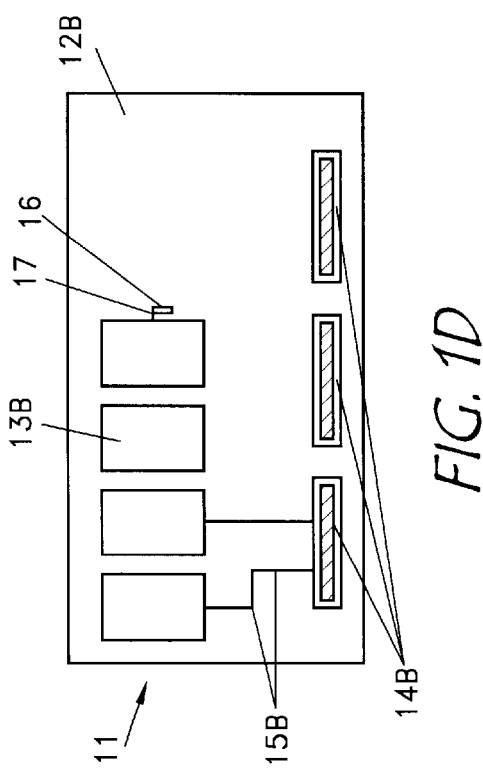
FIG. 1D is a rear view of a daughter circuit board.

Referring now to FIG. 1D, there is shown a rear view of daughter circuit board 11. Electronic components 13b are mounted on the surface 12b. Via 16 allows electrical access to the first surface 12a of the daughter circuit board 11. Via conductor 17 allows electric coupling between electronic components 13b and electronic components 13a. Daughter connectors 14b are mounted to the surface 12b. In an implementation of the invention daughter connectors 14b are female type connectors. Daughter connectors 14b are adapted to receive additional daughter connectors on addition daughter circuit boards. Conductive paths 15b electrically couple electronic components 13b and daughter connectors 14b.

Although male/female-type connectors have been shown in the figures, other types of connectors to interconnect the primary board 10 and daughter board 11 would be suitable. For example, Zero Insertion Force (ZIF) connectors would be suitable to interconnect the primary board 10 and the daughter board 11.

Figure 2:
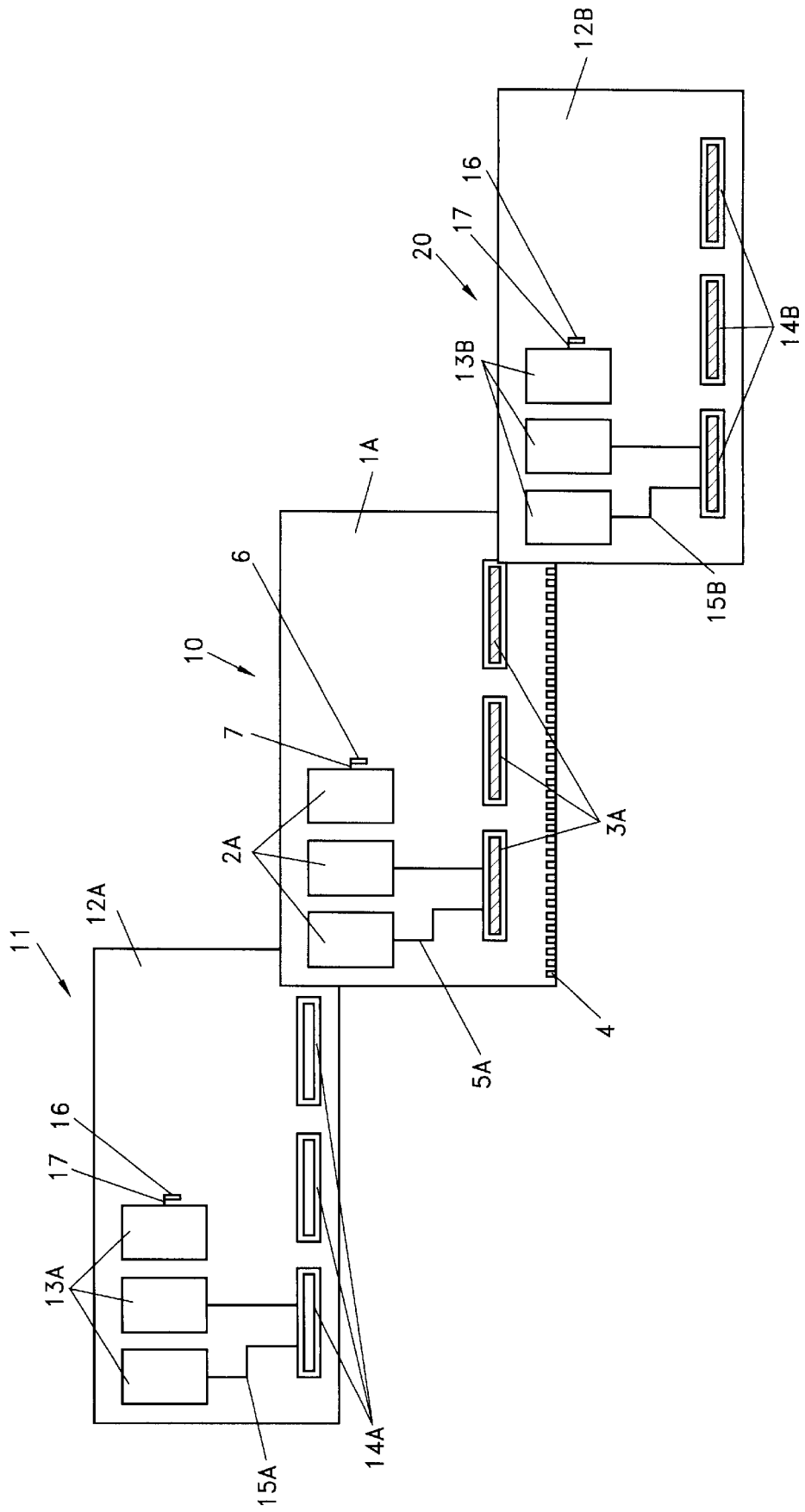
FIG. 2 is a perspective view of the stacked printed circuit board memory module showing the primary board (center) and two daughter boards (front and back).

Referring now to FIG. 2, there is shown a perspective view of a primary circuit board 10, daughter circuit board 11, and daughter circuit board 20. Daughter circuit board 20 has corresponding elements as daughter board 11. In an implementation of the invention the connectors 3a shown as female-type connectors on primary board 10 receive the daughter connectors 14a on daughter board 20. In an implementation the daughter connectors 14a on daughter board 20 are male-type connectors so as to couple with female type primary connectors 3a. In the same implementation male-type connectors 14a on daughter board 11 may be coupled with female-type connectors 3b on primary board 10.

Figure 3A:
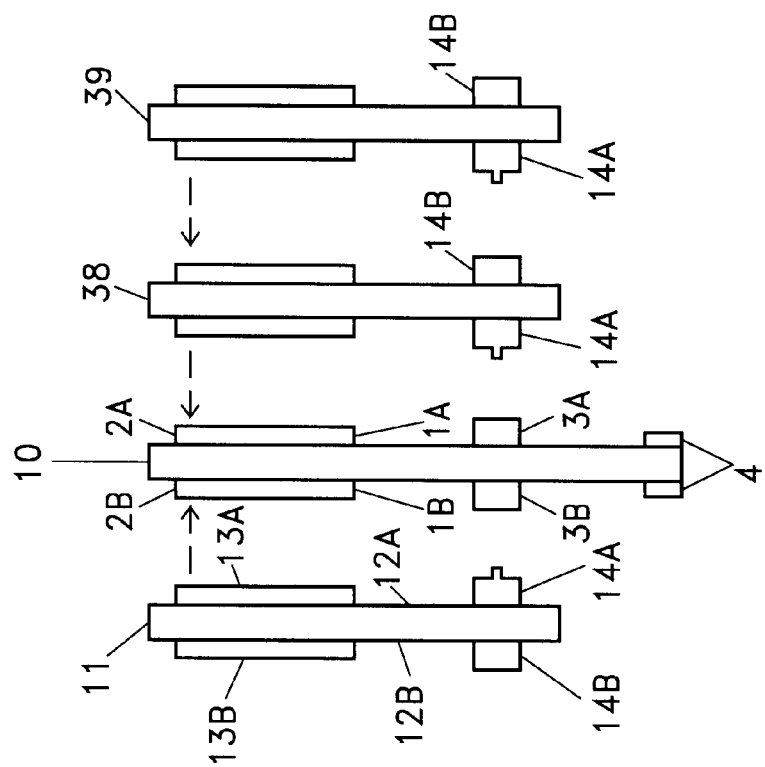
FIG. 3A is a side view of a primary circuit board and three daughter circuit boards before insertion.

Referring now to FIG. 3A, there is shown a side view of primary board 10, daughter board 11, daughter board 38 and daughter board 39. In an implementation, the female-type connector 3a on primary board 10 may be mechanically and electrically coupled with male-type connector 14a on daughter board 38. The female type primary connector 3b may be mechanically and electrically coupled with male-type connector 14a on daughter board 11. Female-type connector 14b on daughter board 38 may be coupled with male-type connector 14a on daughter board 39.

Figure 3B:
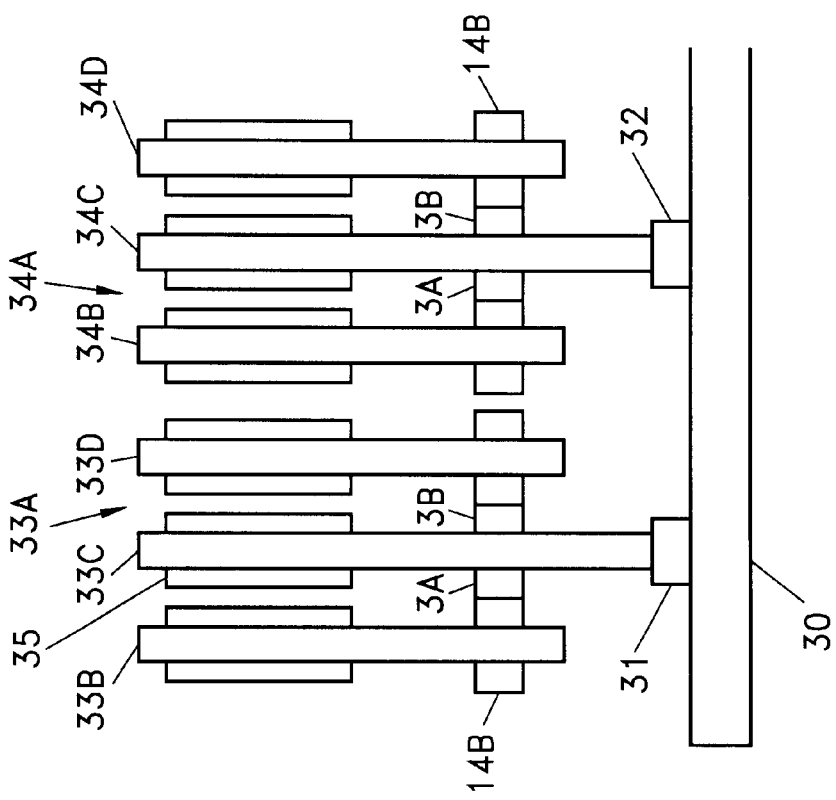
FIG. 3B is a side view of two stacked printed circuit board memory modules having a primary board and two daughter boards, each module inserted into a motherboard.

Referring now to FIG. 3B, there is shown a side view of two stacked printed circuit board memory modules 33a, 34a mounted on a motherboard 30. Module 33a is mounted on motherboard 30 by motherboard connector 31. Module 34a is mounted on motherboard 30 by motherboard connector 32. Module 33a includes a primary board 33c coupled with two daughter boards 33b and 33d. Module 34a includes a primary board 34c coupled with two daughter boards 34b and 34d. Female-type connector 14b on daughter board 33b may receive an additional male-type connector from an additional daughter circuit board. Female-type connector 14b on daughter board 34d may receive an additional male-type connector from an additional daughter circuit board. Upper air channels 35 run along the board between electronic components 13a, 13b between daughter circuit boards 33b, 33d, 34b, 34d, as well as between electronic components 2a, 2b on primary circuit board 33c, 34c and electronic components 14a, 14b on daughter boards 33b, 33d, 34b, 34d. Upper air channels 35 allow for better heat dissipation from the memory modules 33a, 34a thereby increasing overall performance.

The interconnection of the primary connectors 3a, 3b and the daughter connectors 14a, 14b, as well as the interconnection between daughter connectors 14a, 14b allows the daughter circuit boards 33b, 33d, 34b, 34d, and primary boards 33c, 34c to be electrically and mechanically coupled in a substantially spaced and parallel relation. The orientation of the daughter boards 33b, 33d, 34b, 34d and primary boards 33c, 34c is such that all daughter connectors 14a, 14b and all primary connectors 3a, 3b are aligned in a straight line that runs perpendicular to daughter boards 33b, 33d, 34b, 34d and primary boards 33c, 34c.

The linear interconnection between daughter connectors 14a, 14b and primary connectors 3a, 3b at a lower end of the modules 33a, 34a, close to motherboard connectors 31 and 32 allow a decrease in the conductive path (trace length) that address, control and data signals must travel from motherboard 30 to modules 33a, 34a. This decrease in the trace length decreases skew among clock, control and data signals, as well as other transmission line problems such as reflections, cross-talk, and electromagnetic induction.

In an implementation of the invention primary board 33c may be connected to motherboard connector 31 and primary board 34c may be connected to motherboard connector 32 as standalone memory modules. In other implementations daughter circuit boards 33b, 33d, 34b, 34d may be stacked on primary boards 33c, 34c. In further implementations additional daughter circuit boards (not shown) may be stacked onto daughter boards 33b, 34d through daughter connectors 14a, 14b.

Referring now to FIG. 4A, there is shown a front view of an implementation of a primary circuit board 40. Electronic components 42a are mounted on surface 41a. Primary connectors 43 are mounted to the surface 41a. In an implementation of the invention only surface 41a of the primary circuit board has primary connectors 43. Conductive leads 44a run along connecting edge 44b at an edge of primary circuit board 40. Conductive paths 440 electrically couple electronic components 42a, primary connectors 43 and conductive leads 44a. Vias 400 provide electrical access to the other side of primary circuit board 40. Via conductors 410 provide electrical coupling to electronic components on the other side of primary circuit board 40.

Referring now to FIG. 4B, there is shown a rear view of primary circuit board 40. Electronic components 42b are mounted to the surface 41b. Vias 400 provide electrical access to the front side of the primary circuit board 40. Via conductors provide electrical coupling between electronic components 42a and 42b. In an implementation of the invention the rear surface 41b has no primary conductors mounted on it.

Referring now to FIG. 4C, there is shown a front view of a daughter circuit board 45. Electronic components 47a are mounted on surface 46a. Vias 420 provide electrical access to the other side of the daughter circuit board. Via conductor 430 provides electrical coupling to electronic components on the other side of the daughter circuit board 45. Daughter connectors 48 are mounted on the surface 46a. In an implementation of the invention daughter connectors 48 are mounted only on the front surface 46a. Conductive paths 450 electrically couple electronic components 47a and daughter connectors 48.

Referring now to FIG. 4D, there is shown a rear view of daughter circuit board 45. Electronic components 47b are mounted to the surface 46b. Via 420 allows electrical access to the front side of the daughter board 45. In an implementation of the invention no daughter connectors are mounted to surface 46b.

Referring now to FIG. 4E, there is shown a sideview of a stacked printed circuit board memory module 49. In an implementation of the invention, a primary connector 43 on a primary board is electrically and mechanically coupled to a daughter connector 48 on a daughter circuit board 45. There are no other connectors on either the primary or daughter circuit board. Upper air channel 460 runs along the top of the stacked printed circuit board memory module 49 and provides airflow between electronic components 42a on the primary board 40 and the electronic components 47a on the daughter board 45. Improved airflow in this manner improves overall performance of the module 49.

Referring now to FIG. 5A, there is shown a bottom view of a stacked printed circuit board memory module 50 including a primary board 10 and three daughter boards 11, 38, 39. Shown are various daughter connectors 14a, 14b and primary connectors 3a, 3b. The bottom view of the stacked printed circuit board memory module 50 shows that lower air channels 51 are created when the primary connectors 3a, 3b interconnect with the daughter connectors 14a, 14b. Lower air channels 51 allow air to flow to and from lower air channels 51 to upper air channels 35. This airflow allows for improved heat dissipation in the memory module thereby increasing overall performance.

Referring now to FIG. 5B, there is shown a bottom view of an implementation of the stacked printed circuit board memory module 55. A primary board 40 and a daughter circuit board 45 are connected by daughter connectors 48 and primary connectors 43. A lower air channel 52 is created when daughter connectors 48 and primary connectors 43 are interconnected. The lower air channel 52 allows for airflow to and from lower air channel 52 and upper air channel 460. This airflow allows for improved heat dissipation in the memory module thereby increasing overall performance.

Other implementations are within the scope of the following claims.

What is claimed is:

1. A stacked memory module, comprising:
a primary circuit board having a first and second surface adapted for mounting electronic components;
wherein at least the first surface of the primary board has at least one primary connector and at least one electronic component;
a daughter board having a first and second surface adapted for mounting electronic components;
wherein at least the first surface of the daughter board has at least one electronic component and at least one daughter connector;
the primary connectors being adapted for removeably receiving and electrically coupling the daughter connectors such that the first surface of the primary board and the first surface of the daughter board face each other wherein the primary and daughter connectors and the electronic components on said first side of the primary and daughter boards are configured so as to define at least one channel that is free of said connectors and components and which extends between at least two edges of said primary and daughter boards so as to conduct heat from said electronic components away from said primary and daughter boards via said at least one channel;
a control connector adapted to engage with a connecting port on a supporting structure;
the control connector being provided at an end of the primary board; and
wherein the primary circuit board and the daughter circuit board are interconnected in a spaced and substantially parallel relation.

2. A stacked memory module, comprising:
a primary circuit board having a first and second surface adapted for mounting electronic components;
wherein at least the first surface of the primary board has a plurality of primary connectors and at least one electronic component;
a daughter circuit board having a first and second surface adapted for mounting electronic components;

wherein at least the first surface of the daughter circuit board has at least one electronic component and a plurality of daughter connectors;

the primary circuit connectors being adapted for removeably receiving and electrically coupling the daughter connectors such that the first surface of the primary board and the first surface of the daughter board face each other wherein the primary and daughter connectors and the electronic components on said first side of the primary and daughter boards are configured so as to define at least one channel that is free of said connectors and components and which extends between at least two edges of said primary and daughter boards so as to conduct heat from said electronic components away from said primary and daughter boards via said at least one channel;

a control connector adapted to engage with a connecting port at an end of the primary circuit board; and wherein the primary circuit board and the daughter circuit board are interconnected in a spaced and substantially parallel relation.

3. The module of claim 2 wherein the at least one primary connector is oriented perpendicular to the first and second surface of the primary circuit board.

4. The module of claim 2 wherein the at least one daughter connector is oriented perpendicular to the first and second surface of the daughter circuit board.

5. The module of claim 2 wherein the primary and daughter connectors align with each other and are perpendicular to the first and second surface of the primary and the daughter board, whereby a conductive path is minimized between each of the primary and daughter circuit boards.

6. The module of claim 5 wherein the plurality of primary and daughter circuit connectors are spaced such that said channel is created for airflow between the plurality of primary and daughter connectors.

7. The module of claim 2 wherein the at least one primary connector is located between the electronic components and the control connector.

8. The module of claim 2 further comprising a plurality of via connections on the primary board and the daughter boards for electrically coupling the electronic components on the first and second surfaces.

9. The module of claim 2 wherein the electronic components are memory integrated circuits.

10. The module of claim 2 further comprising a memory driver mounted on at least one of the primary circuit board and the daughter circuit boards.

11. A stacked memory module, comprising:

a primary circuit board having a first and second surface adapted for mounting electronic components;

wherein at least the first surface of the primary circuit board has at least one primary connector and at least one electronic component;

a daughter circuit board having a first and second surface adapted for mounting electronic components;

wherein at least one surface of each of the daughter circuit boards has at least one electronic component and at least one daughter connector;

the primary connectors being adapted for removeably receiving and electrically coupling at least one of the daughter connectors such that the first surface of the primary board and the first surface of the daughter board face each other wherein the primary and daughter connectors and the electronic components on said first side of the primary and daughter boards are configured so as to define at least one channel that is free of said connectors and components and which extends between at least two edges of said primary and daughter boards so as to conduct heat from said electronic components away from said primary and daughter boards via said at least one channel;

each of the daughter connectors being adapted for removeably interconnecting and electrically coupling at least one of the remaining daughter connectors on at least one of the remaining daughter circuit boards;

a control connector adapted to engage with a connecting port on a supporting structure;

the control connector being provided at an end of at least one of the primary circuit board and the daughter circuit boards; and wherein the primary circuit board and each of the daughter circuit boards are connected in a spaced and substantially parallel relation.

12. A stacked memory module, comprising:

a primary circuit board having a first and second surface for mounting electronic components;

wherein at least the first surface of the primary circuit board has a plurality of primary connectors and at least one electronic component;

a daughter board having a first and second surface adapted for mounting electronic components;

wherein at least the first surface of the daughter circuit board has at least one electronic component and a plurality of daughter connectors;

the primary connectors being adapted for removeably receiving and electrically coupling at least one of the daughter connectors such that the first surface of the primary board and the first surface of the daughter board face each other wherein the primary and daughter connectors and the electronic components on said first side of the primary and daughter boards are configured so as to define at least one channel that is free of said connectors and components and which extends between at least two edges of said primary and daughter boards so as to conduct heat from said electronic components away from said primary and daughter boards via said at least one channel;

each of the daughter connectors being adapted for removeably receiving and electrically coupling at least one of the remaining daughter connectors on at least one of the remaining daughter circuit boards;

a control connector adapted to engage with a connecting port on a supporting structure;

the control connector being provided at an end of at least one of the primary circuit board and the daughter circuit boards; and wherein the primary circuit board and each of the daughter circuit boards are connected in a spaced and substantially parallel relation.

13. The module of claim 12 wherein each of the plurality of primary connectors is oriented perpendicular to the first surface and second surface of the primary circuit board.

14. The module of claim 12 wherein each of the plurality of daughter connectors is oriented perpendicular to the first surface and second surface of each of the daughter boards.

15. The module of claim 12 wherein each of the primary and daughter connectors align with each other and are perpendicular to the first and second surface of the primary and daughter circuit boards, whereby a conductive path is minimized between each of the primary and daughter circuit boards.

16. The module of claim 15 wherein the plurality of primary and daughter circuit connectors are spaced such that said channel is created for airflow between the plurality of primary and daughter connectors.

17. The module of claim 12 wherein each of the plurality of primary connectors is located between the electronic components and the control connector.

18. The module of claim 12 further comprising a plurality of via connections on the primary board and the daughter boards for electrically coupling the electronic components on the first and second surfaces.

19. The module of claim 12 wherein the electronic components are memory integrated circuits.

20. The module of claim 12 further comprising a memory driver mounted on at least one of the primary circuit board and the daughter boards.

21. A stacked memory module as defined in claim 1 wherein the primary and daughter connectors and the electronic components on the primary and daughter boards are configured such that the at least one channel defined thereby extends between said primary and daughter boards from a first edge of each of the primary and daughter boards and between at least two adjacent connectors on the primary and daughter boards and adjacent said electronic components on said primary and daughter boards to at least a second edge of each of the primary and daughter boards.

22. A stacked memory module as defined in claim 2 wherein the primary and daughter connectors and the electronic components on the primary and daughter boards are configured such that the at least one channel defined thereby extends between said primary and daughter boards from a first edge of each of the primary and daughter boards and between at least two adjacent connectors on the primary and daughter boards and adjacent said electronic components on said primary and daughter boards to at least a second edge of each of the primary and daughter boards.

23. A stacked memory module as defined in claim 11 wherein the primary and daughter connectors and the electronic components on the primary and daughter boards are configured such that the at least one channel defined thereby extends between said primary and daughter boards from a first edge of each of the primary and daughter boards and between at least two adjacent connectors on the primary and daughter boards and adjacent said electronic components on said primary and daughter boards to at least a second edge of each of the primary and daughter boards.

24. A stacked memory module as defined in claim 12 wherein the primary and daughter connectors and the electronic components on the primary and daughter boards are configured such that the at least one channel defined thereby extends between said primary and daughter boards from a first edge of each of the primary and daughter boards and between at least two adjacent connectors on the primary and daughter boards and adjacent said electronic components on said primary and daughter boards to at least a second edge of each of the primary and daughter boards.

* * * * *